United States Patent
Jamshidi et al.

(10) Patent No.: US 6,914,848 B2
(45) Date of Patent: Jul. 5, 2005

(54) WORD LINE TRANSISTOR STACKING FOR LEAKAGE CONTROL

(75) Inventors: Shahram Jamshidi, Cupertino, CA (US); Sadarshan Kumar, Fremont, CA (US); Sadhana Madhyastha, Los Altos, CA (US)

(73) Assignee: Intel Corporation, Santa Clara, CA (US)

( * ) Notice: Subject to any disclaimer, the term of this patent is extended or adjusted under 35 U.S.C. 154(b) by 149 days.

(21) Appl. No.: 10/461,562

(22) Filed: Jun. 12, 2003

(65) Prior Publication Data

US 2004/0252574 A1 Dec. 16, 2004

(51) Int. Cl.⁷ .................................................. G11C 8/00
(52) U.S. Cl. ................................... 365/230.06; 365/129
(58) Field of Search .............................. 365/129, 230.06

(56) References Cited

U.S. PATENT DOCUMENTS 6,781,892 B2 * 8/2004 Hsu et al. .............. 365/189.11
6,801,456 B1 * 10/2004 Hsu et al. .............. 365/185.18

* cited by examiner

Primary Examiner—Michael Tran
(74) Attorney, Agent, or Firm—Jeffrey B. Huter

(57) ABSTRACT

A memory, such as a register file or a cache, having stack pMOSFETs shared among its word line drivers, where a stack pMOSFET shared by a set of word line drivers has its drain connected to the sources of the pMOSFETs in the set or word line drivers, and were each stack pMOSFET is controlled by an enable signal so as to turn ON only if its corresponding set of word line drivers is enabled. The enable signal may be provided by a write or read enable port, or by the memory's address decoder. The stacked configuration of pMOSFETs significantly reduces sub-threshold leakage current in the word line drivers with very little penalty in performance.

12 Claims, 5 Drawing Sheets

WORD LINE TRANSISTOR STACKING FOR LEAKAGE CONTROL

FIELD

The present invention relates to memory circuits, and more particularly, to register files or caches with reduced sub-threshold leakage current.

BACKGROUND

Sub-threshold leakage current in a MOSFET (Metal-Oxide-Semiconductor-Field-Effect-Transistors) is the drain-to-source current present when the gate-to-source voltage of the MOSFET is zero. As CMOS process technology scales to smaller dimensions, the sub-threshold leakage current density in a transistor increases. Unless properly addressed, this increase may lead to a relatively substantial amount of wasted power in various functional units of a computer system, such as register files or caches. For example, consider a computer system, such as that illustrated in FIG. 1. In FIG. 1, die 102 comprises a microprocessor with many sub-blocks, such as arithmetic logic unit (ALU) 104, register file 105, and on-die cache 106. Die 102 may also communicate to other levels of cache, such as off-die cache 108. Higher memory hierarchy levels, such as system memory 110, are accessed via host bus 112 and chipset 114. In addition, other functional units not on die 102, such as graphics accelerator 116 and network interface controller (NIC) 118, to name just a few, may communicate with die 102 via appropriate busses or ports. Each of these functional units may physical reside on one die or more than one dice. Some or parts of more than one functional unit may reside on the same die.

Sub-threshold leakage current in register file 105 or cache 106 may represent a substantial amount of wasted power in those functional units. It is desirable for such functional units to be modified to reduce sub-threshold leakage current with minimal increase in circuit complexity.

DESCRIPTION OF EMBODIMENTS

Figure 1:
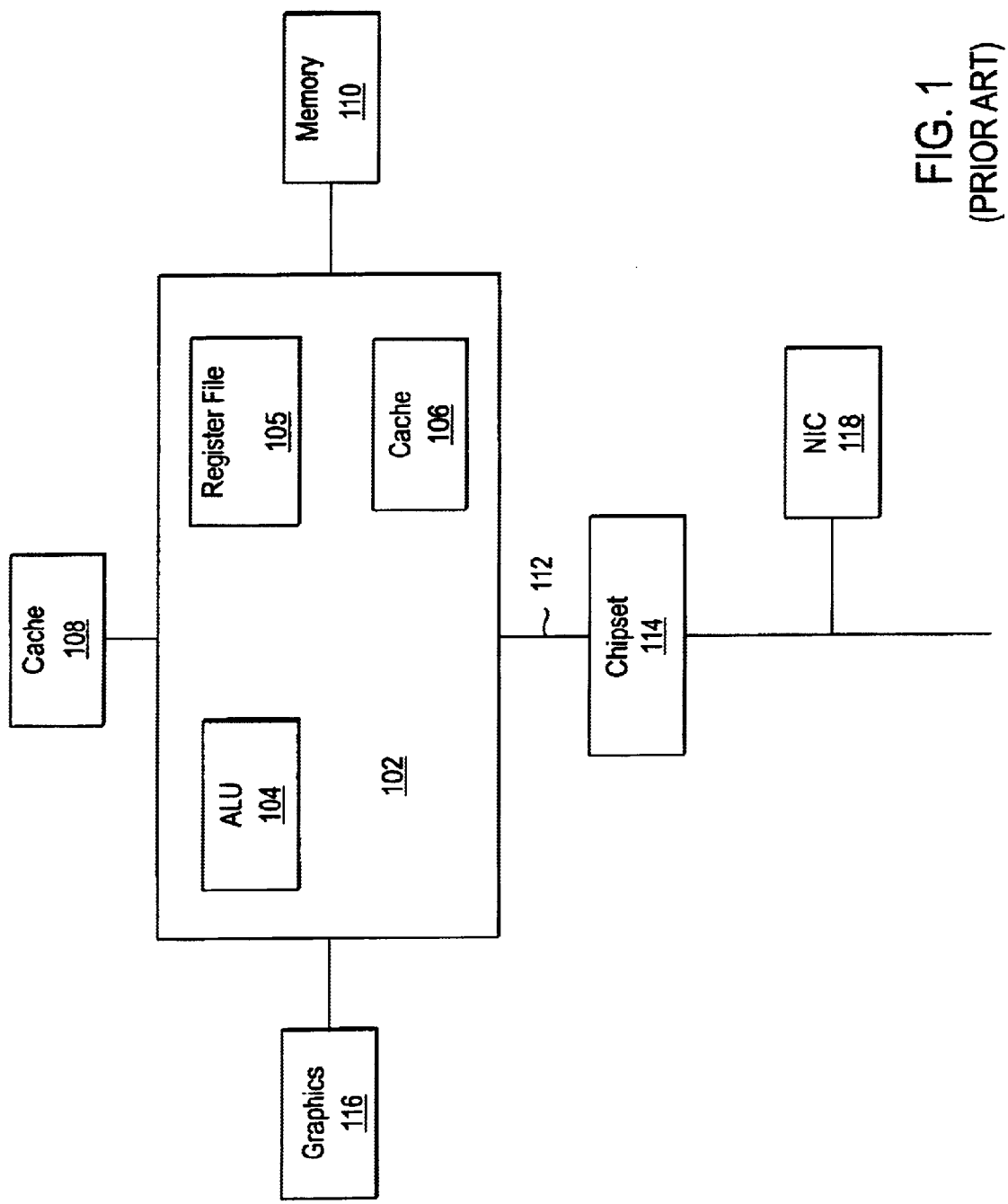
FIG. 1 illustrates a computer system.
Figure 2:
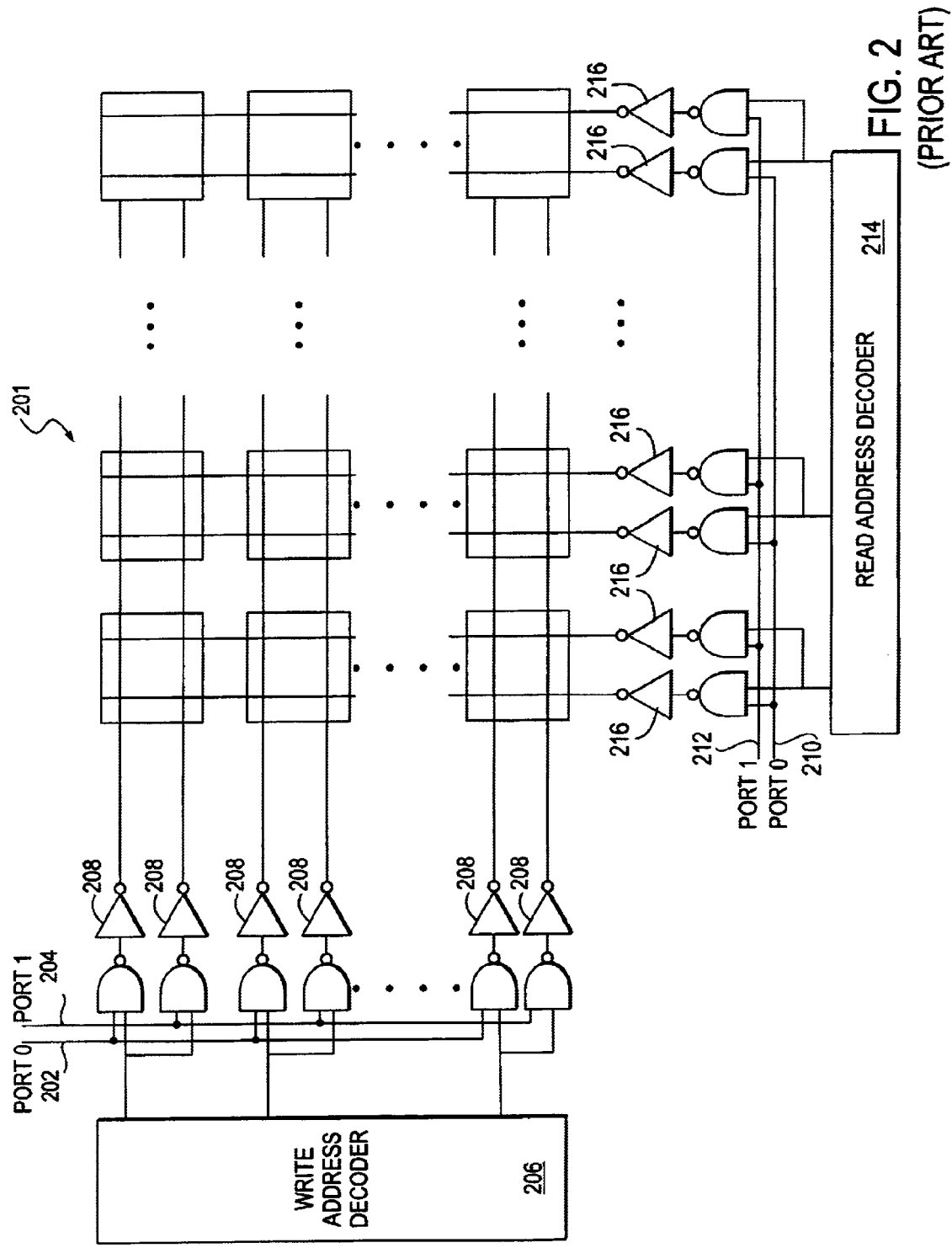
FIG. 2 illustrates a prior art multi-ported register file.

FIG. 2 provides an abstraction of a prior art register file, comprising an array of memory cells 210. For simplicity, a two ported (for both writes and reads) register file is shown. The combination of one of write ports 202 or 204 being asserted HIGH and write address decoder 206 decoding a write address causes one of word line drivers 208 to drive its corresponding word line HIGH. Similarly, the combination of one of read ports 210 or 212 being asserted HIGH and read address decoder 214 decoding a read address causes one of word line drivers 316 to drive its corresponding word line HIGH. For simplicity, data ports and bit lines are not shown in FIG. 2.

Figure 3:
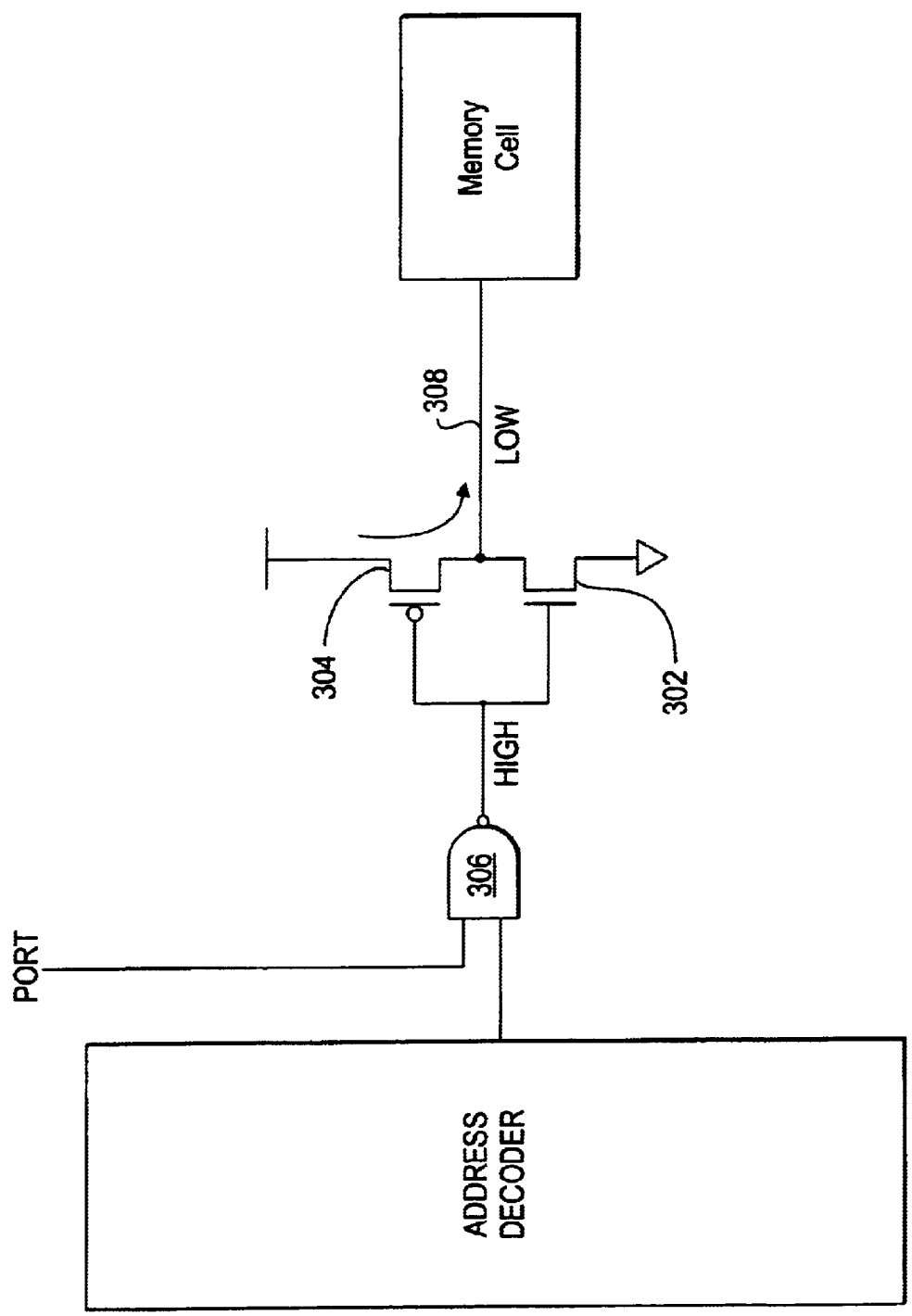
FIG. 3 depicts sub-threshold leakage current in a word line driver for the prior art register file of FIG. 2.

Word line drives for read and write operations are generally sized to drive relatively long interconnects with a substantially large amount of loading. As a result, in the OFF state, these word line drivers contribute to a sizeable portion of leakage power. This is depicted in FIG. 3, illustrating a typical word line driver comprising nMOSFET 302 and pMOSFET 304. When the output port of NAND gate 306 is HIGH, word line 308 is LOW, and the gate-to-source and source-to-drain voltages of pMOSFET 304 are, respectively, zero and $V_{cc}$. In this case, sub-threshold leakage current in pMOSFET 304 flows into word line 308 as indicated by the arrow in FIG. 3. In one study of a single-ported, 128 entry, 32 bit data register file, it was found that 32% of total leakage power originated from the word line drivers.

Figure 4:
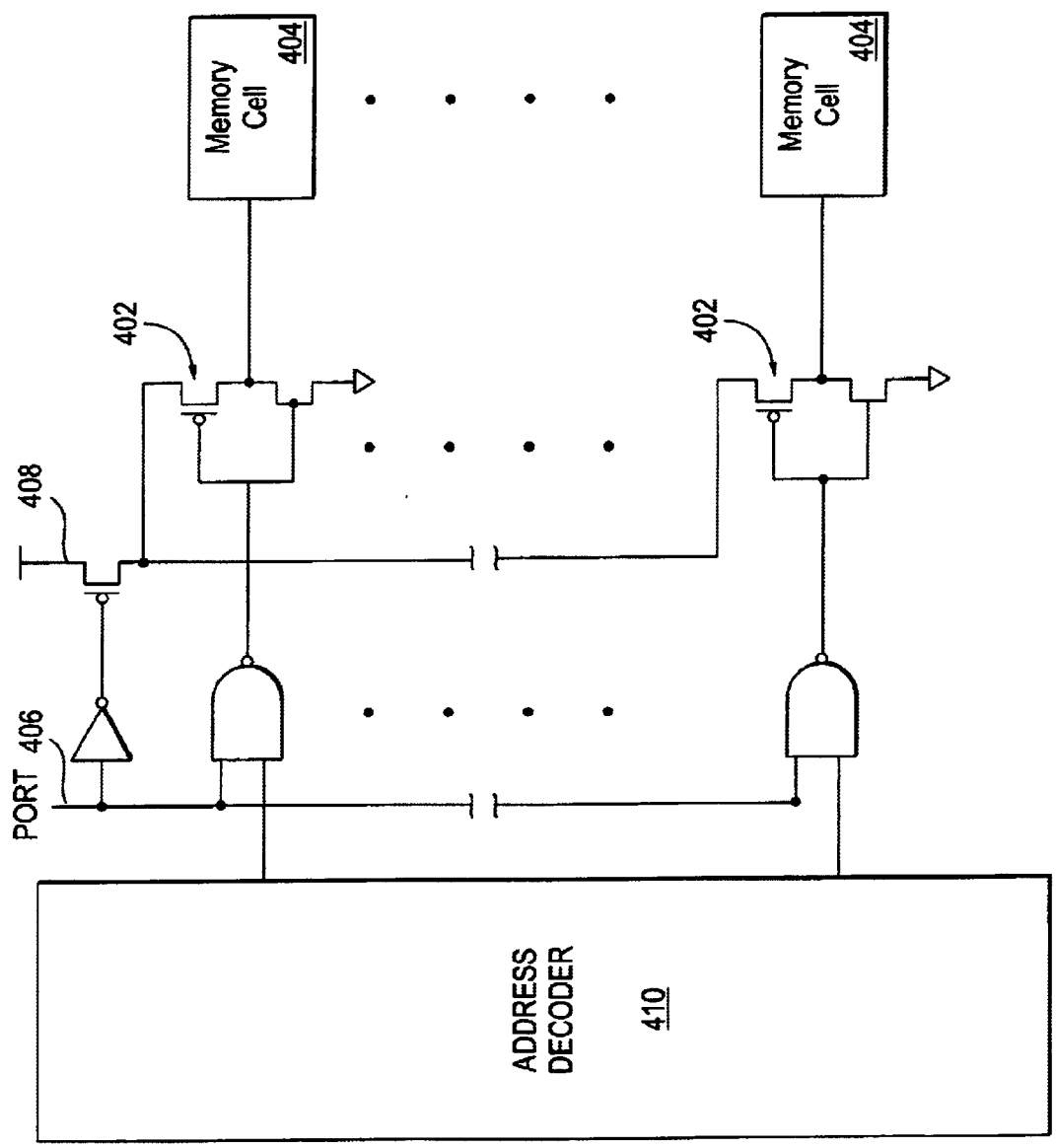
FIG. 4 illustrates an embodiment of the present invention.

FIG. 4 illustrates an embodiment of the present invention, where for simplicity only two word line drivers 402, two memory elements 404, and one port (read or write) 406 are shown. The drain of pMOSFET 408 is connected to the sources of the pMOSFETs in each of drivers 402. The combination of pMOSFET 408 and the pMOSFET in any-one of drivers 402 is recognized as being in a stacked configuration. If port 406 is LOW, then none of the word lines coupled to port 406 are asserted, in which case pMOSFET 408 is OFF and the pMOSFET in each of drivers 402 is OFF. This stacked arrangements of pMOSFETs turned OFF significantly reduces sub-threshold leakage current in drivers 402. When a write (or read) operation is to be performed, port 406 is asserted, turning ON pMOSFET 408 so that the particular driver asserted by address decoder 410 will operate properly.

In the example of FIG. 4, an "enable" signal, namely the voltage on port 406, was available to selectively turn ON and OFF a pMOSFET stacked with the drivers controlled by port 406. However, for register files and caches, whether single-ported or multi-ported, the drivers and word lines may be grouped into sets (banks) such that an enable signal is generated by an address decoder for each set. In such a case, a stack pMOSFET for each set may be utilized by sharing it with all drivers with the set.

Figure 5:
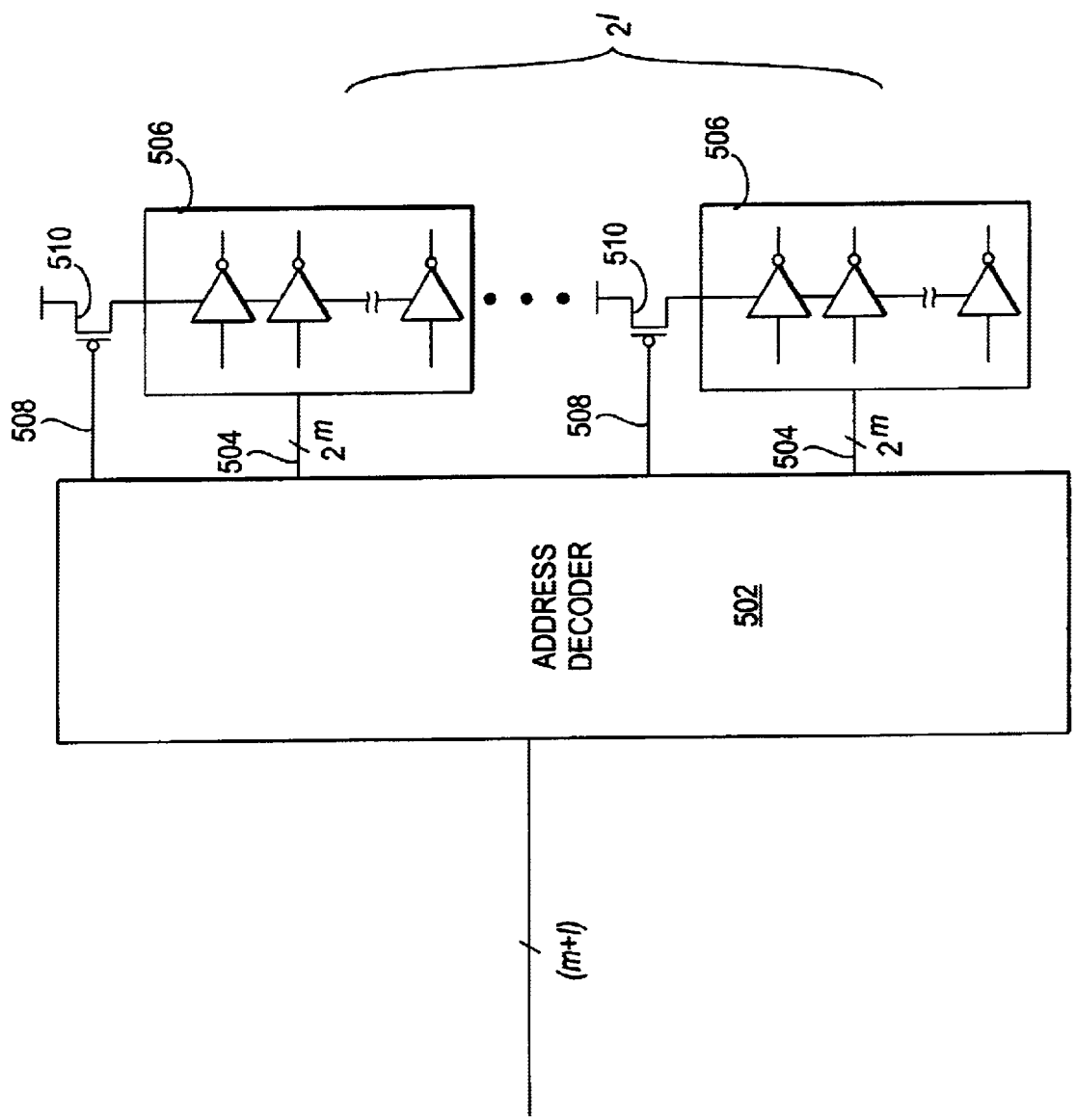
FIG. 5 illustrates another embodiment of the present invention.

For example, in FIG. 5, address decoder 502 decodes $(m+1)$ bits by asserting one of $2^{m+1}$ address lines 504. The drivers and the word lines that they drive are divided into $2^1$ sets 506, where each set has $2^m$ drivers. (For simplicity, FIG. 5 does not show word lines, memory elements, and other ports and associated logic). Address decoder also generates $2^1$ enable signals on enable signal ports 508, where the $2^1$ enable signal ports 508 are in one-to-one correspondence with the $2^1$ sets of drivers. Each enable signal port is connected to the gate of a stack pMOSFET 510 in a stacked configuration with each pMOSFET in the set of drivers 506 corresponding to the enable signal port. That is, there is a set of $2^1$ stack pMOSFETs in one-to-one correspondence with the class of $2^1$ sets of drivers. Each enable port is held HIGH, except if a driver is to be turned ON by address decoder 502, then the enable port corresponding to that driver's set is brought LOW to turn ON the corresponding stack pMOSFET.

The enable signals may be generated by decoding the most significant 1 bits of the (m+1) bit address. In this way, the enable signal is generated before the corresponding address line signal is generated, so that there is very little penalty in performance. The additional complexity of providing the enable signals is relatively minor and does not appreciably increase power dissipation. For example, a simulation for a single-ported 128 entry 32 bit?? data register file in which each stack pMOSFET is shared with 16 word line drivers showed that there was only a 2.5% delay penalty but 83% less leakage power in the word line drivers compared to not using any stack pMOSFETs. In this simulation, the size of a stack pMOSFET was between 5% and 10% of the total pMOSFET device size for the prior art inverters driving a block of 16 word lines.

Various modifications may be made to the disclosed embodiments without departing from the scope of the invention as claimed below. Furthermore, it is to be understood in these letters patent that the phrase "A is connected to B" means that A and B are directly connected to each other by way of an interconnect, such as metal or polysilicon. This is to be distinguished from the phrase "A is coupled to B", which means that the connection between A and B may not be direct. That is, there may be an active device or passive element between A and B.

What is claimed is:

1. A memory comprising:
   a set of word lines;
   a set of word line drivers in one-to-one correspondence with the set of word lines, each word line driver comprising a pMOSFET comprising a gate and a source;
   an enable port to enable a subset of the set of word line drivers; and
   a stack pMOSFET comprising a drain connected to the sources of the pMOSFETs in the subset of word line drivers, and comprising a gate coupled to the enable port so that the stack pMOSFET is ON only if the subset of word line drivers is enabled by the enable port.

2. The memory as set forth in claim 1, wherein the enable port is a write enable port.

3. The memory as set forth in claim 1, wherein the enable port is a read enable port.

4. The memory as set forth in claim 1, further comprising:
   an address decoder to turn ON a word line driver in the subset of word line drivers only if the word line driver is enabled, and to provide an enable signal on the enable port to enable the subset of word line drivers.

5. A memory comprising:
   an address decoder to decode a m+l bit address;
   $2^l$ sets of word line drivers, each set of word line drivers comprising $2^m$ word line drivers, each word line driver comprising a pMOSFET comprising a source;
   $2^l$ stack pMOSFETs in one-to-one correspondence with the $2^l$ sets of word line drivers, each stack pMOSFET comprising a gate and comprising a drain connected to the sources of the $2^m$ pMOSFETs of its corresponding set of word line drivers; and
   $2^l$ enable ports in one-to-one correspondence with the $2^l$ stack pMOSFETs and the $2^l$ sets of word line drivers, wherein each enable port enables its corresponding set of word line drivers, wherein each stack pMOSFET is ON only if its corresponding set of word line drivers is enabled.

6. The memory as set forth in claim 5, wherein each enable port is a write enable port.

7. The memory as set forth in claim 5, wherein each enable port is a read enable port.

8. The memory as set forth in claim 5, further comprising:
   an address decoder to decode a m+l bit address, wherein the address decoder decodes the most l significant bits of the m+l bit address to provide an enable signal on one of the $2^l$ enable ports to enable the set of word line drivers corresponding to the one of the $2^l$ enable ports.

9. A computer system comprising a microprocessor and a chipset in communication with the microprocessor, the microprocessor comprising a memory, the memory comprising:
   a set of word lines;
   a set of word line drivers in one-to-one correspondence with the set of word lines, each word line driver comprising a pMOSFET comprising a gate and a source;
   an enable port to enable a subset of the set of word line drivers; and
   a stack pMOSFET comprising a drain connected to the sources of the pMOSFETs in the subset of word line drivers, and comprising a gate coupled to the enable port so that the stack pMOSFET is ON only if the subset of word line drivers is enabled by the enable port.

10. The computer system as set forth in claim 9, wherein the enable port is a write enable port.

11. The computer system as set forth in claim 9, wherein the enable port is a read enable port.

12. The computer system as set forth in claim 9, the memory further comprising:
    an address decoder to turn ON a word line driver in the subset of word line drivers only if the word line driver is enabled, and to provide an enable signal on the enable port to enable the subset of word line drivers.

* * * * *